(12) United States Patent
Chau et al.

(10) Patent No.: US 7,430,870 B2
(45) Date of Patent: Oct. 7, 2008

(54) LOCALIZED MICROELECTRONIC COOLING

(75) Inventors: David S. Chau, Chandler, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 218 days.

(21) Appl. No.: 11/174,313

(22) Filed: Jun. 30, 2005

(65) Prior Publication Data

US 2007/0000256 A1 Jan. 4, 2007

(51) Int. Cl.
*F25B 21/02* (2006.01)
(52) U.S. Cl. .............................. 62/3.7; 62/259.2
(58) Field of Classification Search ............. 62/3.7, 62/259.2, 3.2
See application file for complete search history.

(56) References Cited

U.S. PATENT DOCUMENTS

| 5,456,081 | A | 10/1995 | Chrysler et al. |
| 6,365,821 | B1 | 4/2002 | Prasher |
| 6,646,874 | B2 | 11/2003 | Pokharna et al. |
| 6,727,422 | B2 * | 4/2004 | Macris ............... 136/201 |
| 6,743,972 | B2 * | 6/2004 | Macris ............... 136/201 |
| 6,845,622 | B2 | 1/2005 | Sauciuc et al. |

OTHER PUBLICATIONS

Bierschenk et al—Extending the Limits of Air Cooling With Thermoelectrically Enhanced Heat Sinks—2004 Inter Society Conference on Thermal Phenomena.

* cited by examiner

*Primary Examiner*—Melvin Jones
(74) *Attorney, Agent, or Firm*—Kathy Ortiz

(57) ABSTRACT

An apparatus and associated method to provide localized cooling to a microelectronic device are generally described. In this regard, according to one example embodiment, a cooling system comprising one or more thermoelectric cooler(s) is thermally coupled to a heat spreader to provide cooling to one or more hot spot(s) of a microelectronic device.

31 Claims, 5 Drawing Sheets

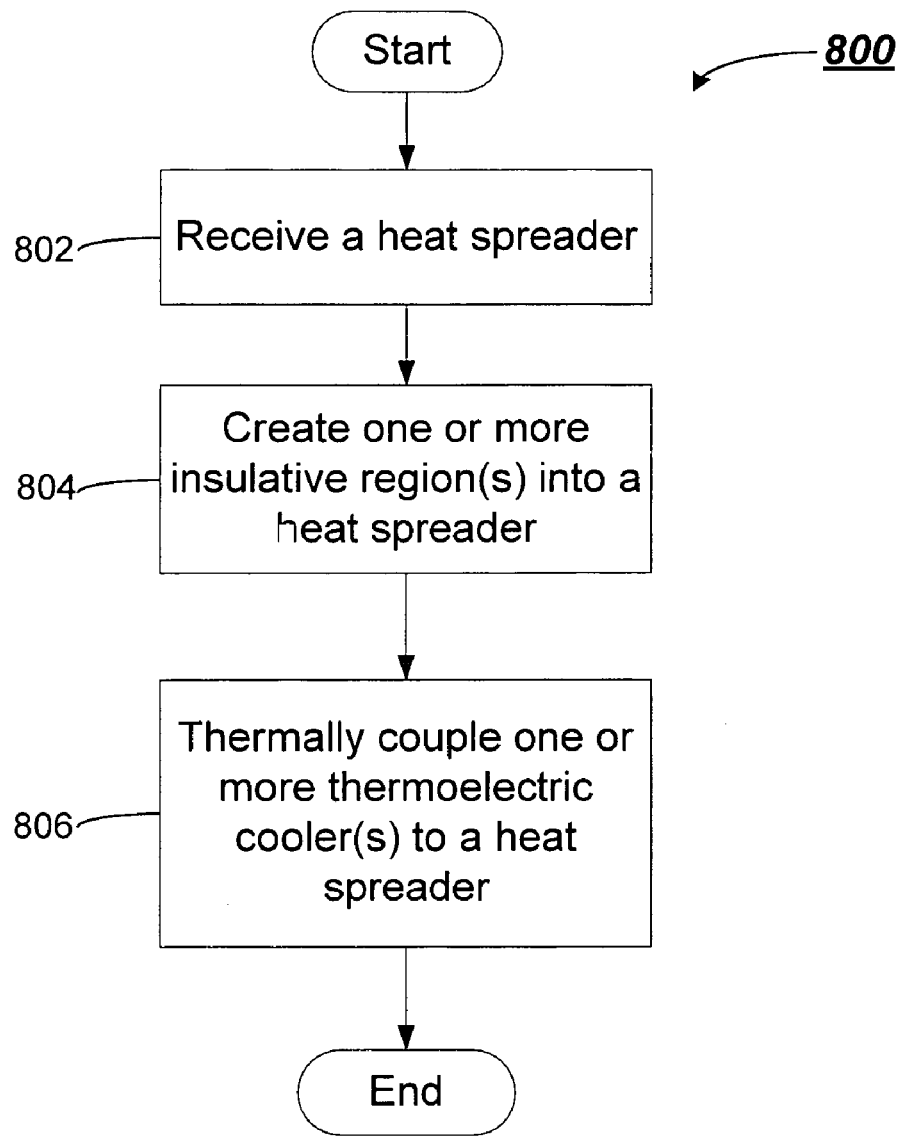

LOCALIZED MICROELECTRONIC COOLING

TECHNICAL FIELD

Embodiments of the present invention are generally directed to microelectronic cooling systems and, more particularly, to apparatuses and associated methods for localized microelectronic cooling.

BACKGROUND

Microelectronic devices generate heat as a result of the electrical activity of the internal circuitry. In order to minimize the damaging effects of this heat, thermal management systems have been developed to remove the heat. Such thermal management systems have included heat sinks, heat spreaders, fans, and various combinations that are adapted to thermally couple with the microelectronic device.

With the development of faster, more powerful, and more densely packed microelectronic devices such as processors, traditional methods of cooling may be ineffective, inefficient, or impractical. For example, processors may have local high heat flux regions called hot spots that create elevated and non-uniform temperature distributions within the die package and cooling system. Resultant overheating compromises the reliability and speed of such devices. Hot spots may need more cooling than traditional cooling methods can provide. In this regard, improved cooling technology is needed to remove the generated heat from localized hot spots of microelectronic devices to prevent overheating.

Thermoelectric coolers (TEC) or Peltier devices and associated techniques are emerging as an improved thermal solution for high-power, densely populated microelectronic devices such as processors and other integrated circuit dies. A thermoelectric cooler may have a cold side where heat is absorbed by electrons as they pass from a low energy level in a p-type semiconductor element, to a higher energy level in an n-type semiconductor element. A power supply may provide the energy to move the electrons through the system. At a hot side, energy may be expelled to a heat sink as electrons move from a high energy level element (n-type) to a lower energy level element (p-type).

One current technique employs a TEC directly deposited on the back side of a die (U.S. Pat. No. 6,365,821). Placement of the TEC on the die, however, presents several problems. First, placement on the die creates power delivery problems; providing power to the TEC through the die is difficult because the back side of the die is typically inactive. Also, creating a power supply to the backside of a die involves tampering with an expensive and sensitive die fabrication process. Second, the creation of TEC elements on the backside of a die complicates die fabrication by introducing one or more additional step(s) and material set(s) into the fabrication process. Finally, placement of the TEC on the die backside may not remove heat as effectively as a TEC placed elsewhere. Therefore, improvements are needed to enhance TEC cooling efficiency of local hot spots, to more simply provide power to a TEC, and to provide spot cooling benefits of a TEC without unduly complicating the die fabrication process.

BRIEF DESCRIPTION OF THE DRAWINGS

Embodiments of the present invention are illustrated by way of example, and not by way of limitation, in the figures of the accompanying drawings in which like reference numerals refer to similar elements and in which:

FIG. 8 is a flow chart of an example method to fabricate an improved microelectronic cooling system, according to but one example embodiment.

DETAILED DESCRIPTION

Embodiments of a microelectronic cooling apparatus and corresponding methods are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1A:
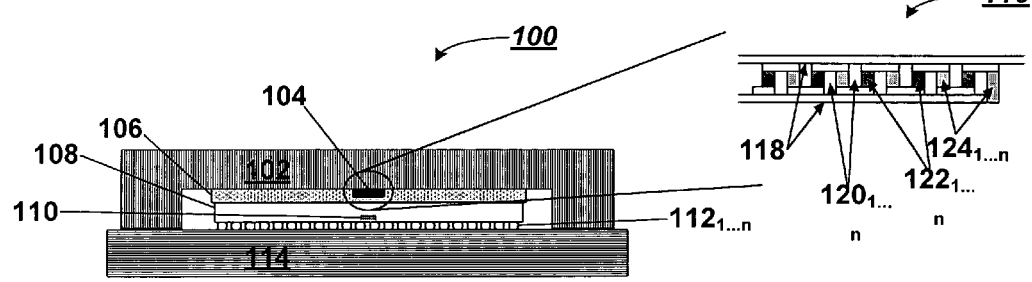
FIG. 1a is a side view of an example microelectronic cooling system using an example thermoelectric cooler applied to an example die package configuration, according to but one example embodiment.

FIG. 1a provides a side view of an example microelectronic cooling system 100 applied to an example die package configuration comprising a localized TEC 104, heat spreader 102, thermal interface material (TIM) 106, microelectronic die 108, local hot spot 110, array of solder balls $112_{1 \ldots n}$ (where n represents a variable number of repeating structures), and substrate 114, each coupled as shown, according to but one embodiment. Array of solder balls $112_{1 \ldots n}$ may provide one or more electrical power and/or signal connections between die 108 and another component such as substrate 114.

In alternative embodiments of FIG. 1a, microelectronic die 108 may be electrically coupled to various other systems, components, or devices such as another microelectronic die, for example.

In another embodiment, one or more TEC elements 104 may be thermally coupled to a heat spreader 102. As used in this description, "heat spreader" 102 is a general term that includes a variety of heat spreading devices such as an integral heat spreader (IHS), heat sinks, and/or heat pipes among others. Heat spreader 102 depicted in FIG. 1a is of the IHS variety, but the invention is not limited in this regard. TEC element(s) 104 may be located over, near or adjacent to one or more local hot spot(s) 110 to provide spot cooling. The length, width, and thickness of the TEC 104 may be selected for the power dissipation and temperature requirements of the targeted hot spot. A localized TEC element 104 may provide a benefit of providing directed cooling to particular hot spot(s) 110 of a microelectronic die while consuming less power and space than a TEC element that generally provides cooling for an entire die, for example. Such localized cooling may improve overall cooling efficiency.

Coupling one or more localized TEC(s) 104 to a heat spreader 102 may provide advantages over coupling to the backside of a die. First, coupling one or more TEC(s) 104 to a heat spreader 102 provides greater temperature suppression while requiring lower input power than a TEC coupled to a die backside. Second, coupling one or more TEC(s) 104 to a heat spreader 102 simplifies the die fabrication process because TEC element(s) 104 may be attached to the heat spreader 102 in an independent process. Finally, coupling one or more TEC(s) 104 to a heat spreader 102 simplifies the TEC power supply problem because power can be provided through the heat spreader 102 instead of the inactive side of a die.

Coupling one or more localized TEC(s) 104 to a heat spreader 102 may provide additional thermal benefits. A TEC 104 may have a cold side where heat is absorbed by electrons as they pass from a low energy level in a p-type semiconductor element, to a higher energy level in an n-type semiconductor element. A power supply may provide the energy to move the electrons through the system. At a hot side, energy may be expelled to a heat spreader 102 as electrons move from a high energy level element (n-type) to a lower energy level element (p-type). If the hot side of a TEC 104 is attached to a heat spreader 102, hot side resistance may be reduced, which may enhance TEC 104 performance. Attaching power leads to the hot side of a TEC 104 may result in a heat source or a conduction path. Either case may provide a thermal benefit. Additional power dissipation from a heat source would not be drawn into the cold side of TEC 104 as it would if a TEC 104 were placed on the backside of a die 108 and the power leads were connected to the cold side of the TEC 104. A conduction path would conduct heat away from the TEC 104 rather than toward it.

In one embodiment, a cold side of one or more TEC(s) 104 is thermally coupled to one or more hot spot(s) 110 of a microelectronic device 108 and a hot side of one or more TEC(s) 104 is thermally coupled to a heat spreader 102.

A variety of suitable techniques may be used to couple one or more TEC(s) 104 to a heat spreader 102 including, but not limited to, sputtering, plating, screening, solder attachment, and direct attachment methods.

Solder attachment may involve any of various solderable materials, including fusible alloys such as lead or tin, to join parts. In one embodiment, an Indium-based alloy is used in a solder attachment process to couple one or more TEC(s) 104 to a heat spreader 102.

Direct attachment may involve a fabrication process to integrate a densely packed thin-film TEC 104 on a heat spreader 102 surface. Such process may comprise patterning a heat spreader 102 with electrodes and fabricating p and/or n type materials via sputtering, molecular beam epitaxy, crystal growth, or any other suitable method. Direct attachment may involve any suitable method for fabricating a TEC 104 on a heat spreader 102 surface.

Although TEC 104 is depicted as being coupled to the underside of heat spreader 102 and partially embedded in the TIM 106, other locations for coupling one or more TEC(s) to a heat spreader 102 are envisioned. For example, in an embodiment, one or more TEC(s) 104 may be coupled to any surface of a heat spreader 102. In another embodiment, one or more TEC(s) 104 may be coupled to the topside (i.e.—the surface farthest from the microelectronic device 108) of a heat spreader 102. In another example, one or more TEC(s) 104 may be coupled to multiple surfaces of multiple heat spreaders 102. Suitable locations for coupling one or more TEC(s) 104 to a heat spreader 102 will vary based on local cooling needs and design of the microelectronic device 108.

Figure 1B:
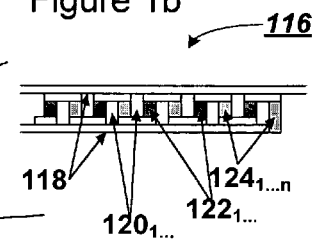
FIG. 1b is an exploded side view of an example thermoelectric cooler, according to but one example embodiment.

FIG. 1b is an exploded side view of an example TEC 116, according to but one example embodiment. In accordance with the illustrated embodiment, TEC 116 may comprise electrical insulation 118, thermal insulation $120_{1\ldots n}$, negative elements $122_{1\ldots n}$, and positive elements $124_{1\ldots n}$, each coupled as shown, where n represents a variable number of repeating structures. TEC 116 may comprise a variety of materials including, but not limited to, Bismuth Telluride, super-lattice materials, semiconductor materials, ceramics, and organic materials.

Figure 2A:
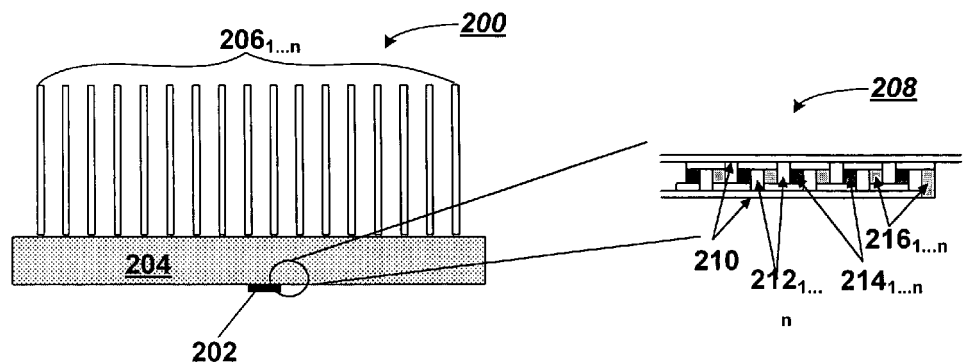
FIG. 2a is a side view of an example microelectronic cooling system using an example thermoelectric cooler coupled to a heat sink configuration, according to but one example embodiment.

FIG. 2a is a side view of an example microelectronic cooling system 200 using an example TEC 202 coupled to a heat spreader configuration comprising a heat sink 204 and a plurality of fins $206_{1\ldots n}$, according to but one example embodiment. Other embodiments include one or more TEC(s) 202 attached to various other heat spreading devices such as one or more heat pipe(s), one or more IHS(s), one or more heat sink(s), and various combinations and configurations of such heat spreaders.

Figure 2B:
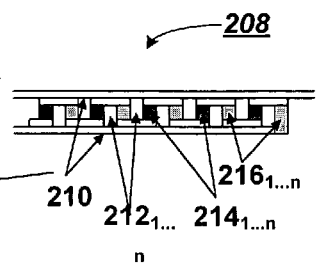
FIG. 2b is an exploded side view of an example thermoelectric cooler, according to but one example embodiment.

FIG. 2b is an exploded side view of an example TEC 208, according to but one example embodiment. In accordance with the illustrated embodiment, TEC 208 may comprise electrical insulation 210, thermal insulation $212_{1\ldots n}$, negative elements $214_{1}\ldots n$, and positive elements $216_{1\ldots n}$, each coupled as shown, where n represents a variable number of repeating structures. TEC 208 may comprise a variety of materials including, but not limited to, Bismuth Telluride, super-lattice materials, semiconductor materials, ceramics, and organic materials.

Figure 3:
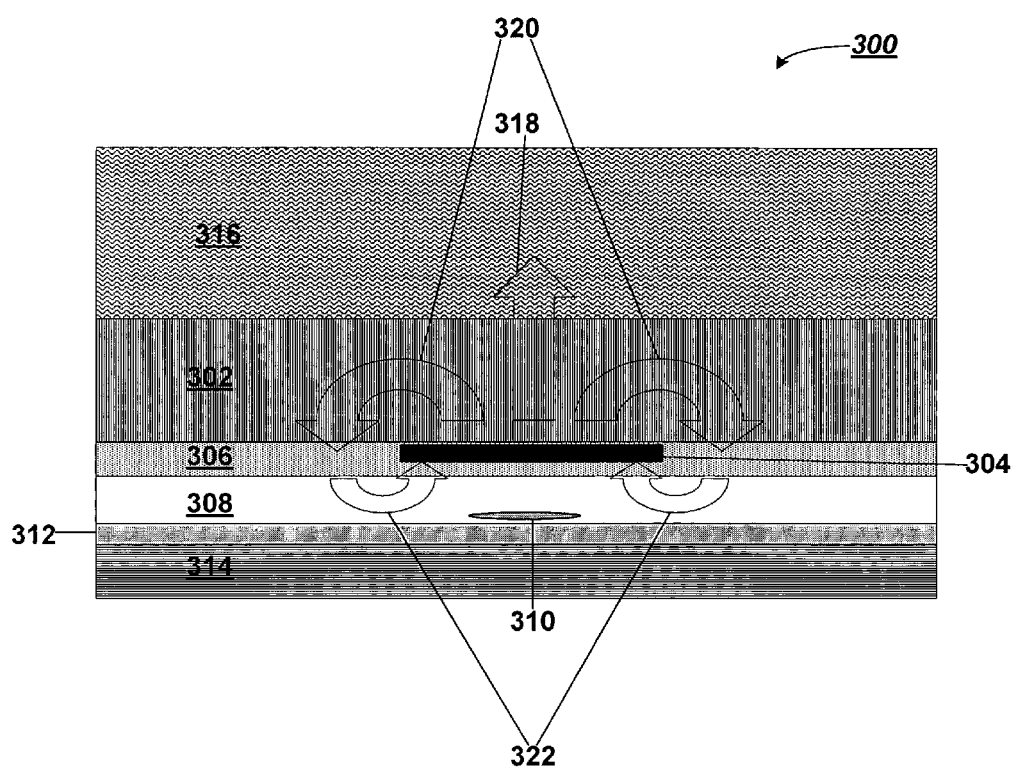
FIG. 3 is an exploded side view of an example microelectronic cooling system using an example thermoelectric cooler applied to an example die package configuration, according to but one example embodiment.

FIG. 3 is an exploded side view of an example microelectronic cooling system 300 using one or more example TEC(s) 304 applied to an example die package comprising a heat spreader 302, TIM 306, microelectronic die 308, hot spot 310, underfill 312, substrate 314, and second level heat sink 316, each coupled as shown according to but one example embodiment. Underfill 312 may comprise one or more electrical power and/or signal connections analogous to array of solder balls $112_{1\ldots n}$.

In one embodiment, TEC 304 removes some heat 318 away from hot spot 310. Some of the removed heat 320, 322 may recirculate through the heat spreader 302, TIM 306, and microelectronic die 308, and flow back into the bottom of TEC 304 following heat conduction paths 320, 322 as shown. Such recirculation of heat 320, 322 may reduce the effectiveness of TEC 304, for example, by reducing the heat 318 pumped from a microelectronic device 308 per unit of power applied to TEC 304. The amount of heat recirculation 320, 322 may depend on TEC 304 geometry, operating conditions, and material properties of TIM 306 and spreader 302. Heat recirculation may be more severe for TEC(s) with a smaller footprint and a higher thermal gradient across the TEC 304.

Figure 4:
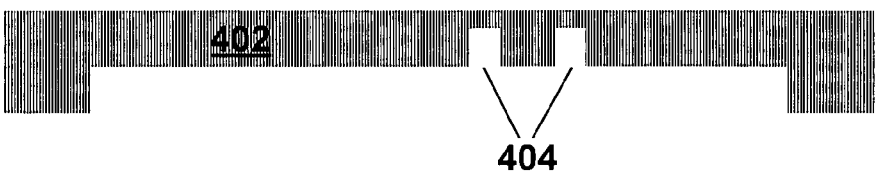
FIG. 4 is a cross-section side view of an example heat spreader, according to but one example embodiment.

FIG. 4 is a cross-section side view 400 of an example heat spreader 402 with one or more insulative region(s) 404. In one embodiment, insulative region(s) 404 may comprise an air gap. In another embodiment, one or more insulative region(s) 404 may substantially surround one or more thermally conductive region(s) that may be adjacent to one or more TEC(s). Such insulative region(s) 404 may prevent circulation of heat back to a microelectronic device. An insulative region(s) 404 comprising an air gap may be created by stamping a heat spreader 402 to remove a portion of the heat spreader material.

Figure 5:
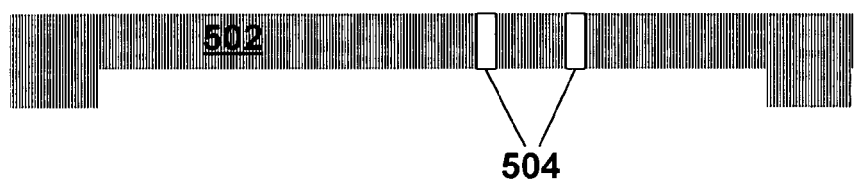
FIG. 5 is a cross-section side view of another example heat spreader, according to but one example embodiment.

FIG. 5 is a cross-section side view 500 of another example heat spreader 502 with one or more insulative region(s) 504. In one embodiment, insulative region(s) 504 may comprise a material or combination of materials that are less thermally conductive than the material of a heat spreader 502. Examples of suitable materials for insulative region(s) 504 may include, but are not limited to, polymers, ceramics, and/or metals such as stainless steel, among others. Common materials for heat spreader 502 may include, but are not limited to, copper, aluminum, or silver among others. An insulative material suitable for insulative region(s) 504 may have a lower thermal conductivity than the material of the heat spreader 502.

In another embodiment, one or more insulative region(s) 504 may substantially surround one or more heat conductive region(s) that may be adjacent to one or more thermoelectric cooler(s). Such insulative region(s) 504 may prevent circulation of heat back to a microelectronic device.

In an embodiment, a material or combination of materials 504 that are less thermally conductive than the material of a heat spreader 502 may be stamped into heat spreader 502. In another embodiment, an insert of insulative material 504 may be an interlocking part that is inserted, placed, or pressed into a heat spreader 502 with corresponding space for such interlocking part.

Figure 6:
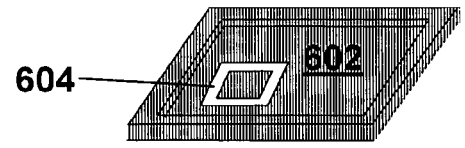
FIG. 6 depicts an angled bottom view of an example heat spreader according to but one example embodiment.

FIG. 6 provides an angled bottom view 600 of an example heat spreader 602 according to but one example embodiment. In accordance with the illustrated embodiment, example heat spreader 602 features an insulative region 604, which may be an insulative region in accordance with various embodiments described above (i.e.—insulative regions 404 and 504). Although insulative region 604 is depicted in a quadrangular configuration, other shapes and configurations are envisioned such that re-ingestion of heat to a microelectronic device that may be attached to heat spreader 602 is reduced. For example, insulative region 604 may be substantially circular.

Design for insulative region(s) 404, 504, 604 including placement and dimensions such as length, width, and depth will vary based on design of TEC(s) 402, 502, 602, design of spreader(s) 402, 502, 602 and anticipated conditions. Considerations for the depth design of insulative region(s) 404, 504, 604 include making insulative regions 404, 504, 604 deep enough to effectively limit heat re-ingestion into the TEC, but not making insulative regions excessively deep, which may make heat removal more difficult and raise the junction temperature of a microelectronic device.

Figure 7:
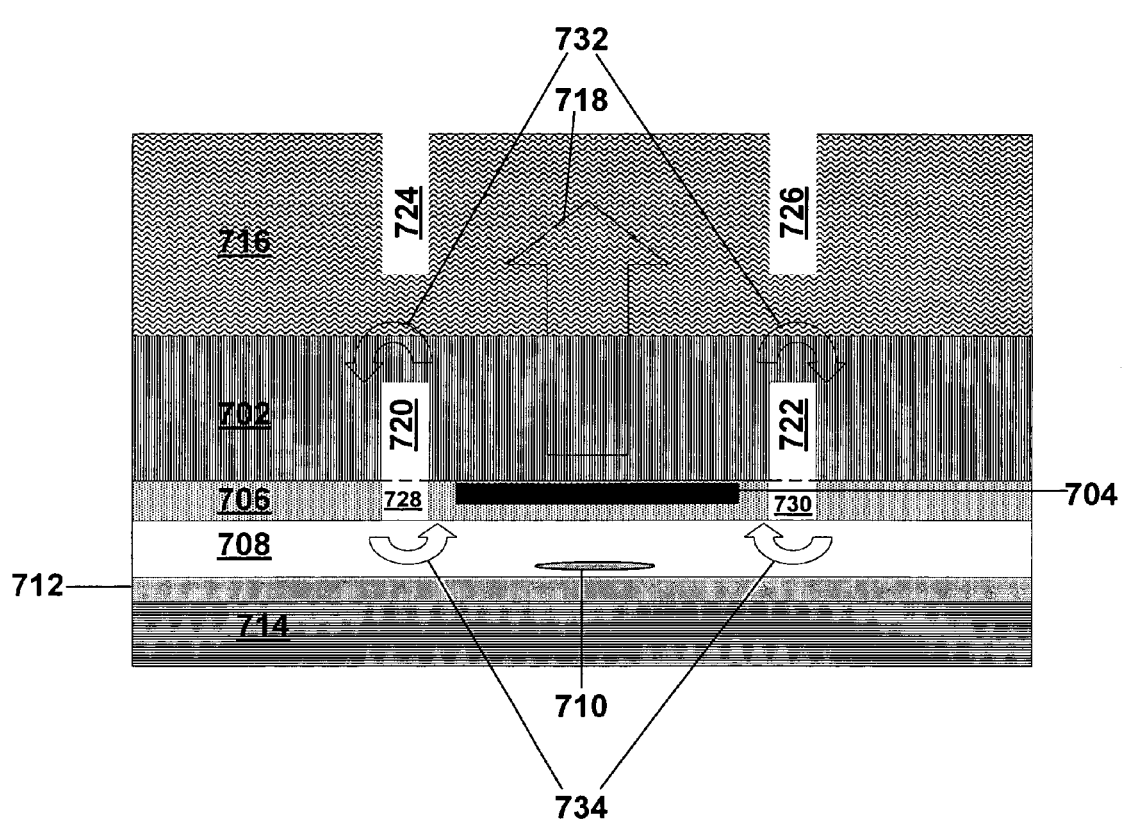
FIG. 7 is an exploded side view of an example microelectronic cooling system using an example thermoelectric cooler applied to an example die package configuration, according to but one example embodiment.

FIG. 7 is an exploded side view of an example microelectronic cooling system 700 using an example TEC 704 applied to an example die package configuration comprising a heat spreader 702, TIM 706, microelectronic die 708, hot spot 710, underfill 712, substrate 714, second level heat sink 716, and insulative regions 720, 722, 724, 726, 728, 730 each coupled as shown according to but one example embodiment. Underfill 712 may comprise one or more electrical power and/or signal connections analogous to array of solder balls $112_{1 \ldots n}$.

In alternative embodiments of FIG. 7, insulative regions 720, 722, 724, 726, 728, 730 may be insulative regions in accordance with various embodiments and various combinations of embodiments already described (i.e.—insulative regions 404, 504, and 604). Additionally, insulative region(s) 728, 730 may be created by patterning or other well-known suitable methods.

In an embodiment, insulative region(s) 720, 722, 724, 726, 728, 730 may comprise an air gap. In another embodiment, insulative region(s) 720, 722, 724, 726, 728, 730 may comprise a material with a thermal conductivity that is lower than the thermal conductivity of the heat spreader. Insulative region(s) 720, 722, 724, 726, 728, 730 may be positioned near or adjacent to a TEC 704 to prevent recirculation of some heat 718 back to a microelectronic device such as a die 708.

In another embodiment, heat flow arrows 718, 732, and 734 may depict the direction of heat flow. One or more insulative regions 720, 722, 724, 726, 728, 730 may provide a benefit of preventing some heat 718 removed by TEC 704 from recirculating back towards a microelectronic device 708. Some heat 732 may flow back toward the microelectronic device 708 and flow back 734 into the TEC 704. However, such recirculation of heat 732, 734 is reduced by insulative regions 720, 722, 724, 726, 728, 730. Use of one or more insulative regions 720, 722, 724, 726, 728, 730 to reduce re-ingestion of heat 732, 734 to one or more TEC(s) 704 may cool hot spots 710 more effectively by allowing the TEC 704 to operate at a higher theoretical efficiency, which, in turn, may enable use of a smaller power supply and a smaller second level heat sink 716.

In another embodiment, one or more of insulative regions 720, 722, 724, 726, 728, 730 may be applied to any heat removal device to cool hot spot(s) 710. Insulative regions 720, 722, 724, 726, 728, 730 may provide a similar benefit, for example, for a TEC that is thermally coupled to the backside of microelectronic die. Insulative region(s) 720, 722, 724, 726, 728, 730 may enhance heat removal efficiency for a TEC 704 or other heat removal apparatus placed at various locations including the backside of a die, a TIM, or a heat spreader for example.

FIG. 8 is a flow chart 800 of an example method to fabricate an improved microelectronic cooling system, according to but one example embodiment. In an embodiment, a method may comprise receiving a heat spreader 802, creating one or more insulative region(s) into a heat spreader 804, and thermally coupling one or more TEC(s) to a heat spreader 806.

In one embodiment, manufacturing equipment may receive a heat spreader 802 and create one or more insulative region(s) in a heat spreader by stamping an air gap into a heat spreader. In another embodiment, manufacturing equipment may receive a heat spreader 802 and create one or more insulative region(s) in a heat spreader by stamping a material or combination of materials that are less thermally conductive than the material of the heat spreader into the heat spreader. Alternatively, creating one or more insulative region(s) in a heat spreader 806 may be accomplished by inserting an interlocking part of insulative material into a heat spreader with corresponding space for such interlocking part. In alternative embodiments, combinations of air gap stamping and material insertion methods may be used to create one or more insulative region(s) in a heat spreader 806.

In one embodiment, insulative regions are created in a heat spreader 806 to correspond with hot spots on a microelectronic device to prevent recirculation of heat through a heat spreader back to a microelectronic device.

In an embodiment, one or more insulative region(s) may be created into a heat spreader 804 before thermally coupling one or more TEC(s) to a heat spreader 806. In another embodiment, one or more TEC(s) may be thermally coupled to a heat spreader 806 before creating one or more insulative region(s) into a heat spreader 804. In another embodiment, manufacturing equipment receives a heat spreader 802 prior to creating one or more insulative region(s) into a heat spreader 804 and a different set of manufacturing equipment receives the heat spreader 802 prior to thermally coupling one or more TEC(s) to the heat spreader 806.

In an embodiment, thermally coupling one or more TEC(s) to a heat spreader 806 may be accomplished by sputtering, plating, screening, solder attachment, or direct attachment methods. In one embodiment, an Indium-based alloy is used in a solder attachment process to thermally couple one or more TEC(s) to a heat spreader 806. In another embodiment, a direct attachment method comprising patterning a heat spreader 102 with electrodes and fabricating p and/or n type materials via sputtering, molecular beam epitaxy, and/or crystal growth is used to thermally couple one or more TEC(s) to a heat spreader.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A cooling apparatus comprising:
a heat spreader; and
one or more thermoelectric cooler(s) thermally coupled to the heat spreader to provide cooling to one or more hot spot(s) of a microelectronic device, wherein a cold side of the one or more thermoelectric cooler(s) is thermally coupled to the one or more hot spot(s) of a microelectronic device and a hot side of the one or more thermoelectric cooler(s) is thermally coupled to the heat spreader.

2. A cooling apparatus according to claim 1, wherein the heat spreader comprises one or more insulative region(s) to prevent circulation of some heat generated by the microelectronic device back to the microelectronic device.

3. A cooling apparatus according to claim 2 wherein the one or more insulative regions(s) substantially surround the heat spreader region adjacent to the one or more thermoelectric cooler(s).

4. A cooling apparatus according to claim 2, wherein the one or more insulative region(s) comprise an inserted material that is less thermally conductive than the material of the heat spreader.

5. A cooling apparatus according to claim 2, wherein the one or more insulative region(s) comprise an air gap.

6. A cooling apparatus according to claim 1, wherein the heat spreader is an integral heat spreader.

7. A cooling apparatus according to claim 1, wherein the heat spreader is a heat sink.

8. A cooling apparatus according to claim 1, wherein the heat spreader is a heat pipe.

9. A cooling apparatus according to claim 1, wherein the microelectronic device is a die.

10. A cooling apparatus according to claim 1, wherein the one or more thermoelectric cooler(s) are thermally coupled to the heat spreader by direct attachment.

11. A cooling apparatus according to claim 1, wherein the one or more thermoelectric cooler(s) are thermally coupled to the heat spreader by solder attachment.

12. A cooling apparatus according to claim 11, wherein the solder attachment comprises an Indium-based alloy.

13. A method comprising:
receiving a heat spreader;
creating one or more insulative region(s) into a heat spreader to substantially surround a heat spreader region adjacent to one or more thermoelectric cooler(s); and
thermally coupling the one or more thermoelectric cooler(s) to the heat spreader.

14. A method according to claim 13, wherein creating one or more insulative region(s) comprises stamping an air gap into the heat spreader.

15. A method according to claim 13, wherein creating one or more insulative region(s) comprises inserting an insulative material with a thermal conductivity lower than the thermal conductivity of the heat spreader into the heat spreader.

16. A method according to claim 15, wherein inserting an insulative material comprises:
stamping an insulative material into the heat spreader.

17. A method according to claim 15, wherein inserting an insulative material comprises:
inserting an interlocking part of insulative material into a heat spreader with corresponding space for such interlocking part.

18. A method according to claim 13, wherein thermally coupling one or more thermoelectric cooler(s) to a heat spreader comprises:
thermally coupling a hot side of the one or more thermoelectric cooler(s) to a heat spreader.

19. A method according to claim 18, further comprising:
thermally coupling a cold side of the one or more thermoelectric cooler(s) to one or more hot spot(s) of a microelectronic device.

20. A method according to claim 13, wherein thermally coupling one or more thermoelectric cooler(s) to a heat spreader comprises a direct attachment method.

21. A method according to claim 13, wherein thermally coupling one or more thermoelectric cooler(s) to a heat spreader comprises a solder attachment method.

22. A method according to claim 21, wherein a solder attachment method comprises using an Indium-based alloy.

23. A cooling system comprising:
a heat spreader;
one or more thermoelectric cooler(s) thermally coupled to the heat spreader to provide cooling to one or more hot spot(s) of a microelectronic device; and
another device electrically coupled to the microelectronic device ,wherein the another device comprises a microelectronic die.

24. A cooling apparatus according to claim 23, wherein the heat spreader comprises one or more insulative region(s) to prevent circulation of some heat generated by the microelectronic device back to the microelectronic device.

25. A cooling apparatus according to claim 24, wherein the one or more insulative region(s) comprise an inserted material that is less thermally conductive than the material of the heat spreader.

26. A cooling apparatus according to claim 24, wherein the one or more insulative region(s) comprise an air gap.

27. A cooling apparatus according to claim 23, wherein the heat spreader is an integral heat spreader.

28. A cooling apparatus according to claim 23, wherein the microelectronic device is a microelectronic die.

29. A cooling apparatus according to claim 23, wherein the one or more thermoelectric cooler(s) are thermally coupled to the heat spreader by direct attachment.

30. A cooling apparatus according to claim 23, wherein the one or more thermoelectric cooler(s) are thermally coupled to the heat spreader by solder attachment.

31. A cooling system according to claim 23, wherein a cold side of the one or more thermoelectric cooler(s) is thermally coupled to the one or more hot spot(s) of a microelectronic device and a hot side of the one or more thermoelectric cooler(s) is thermally coupled to the heat spreader.

* * * * *